United States Patent
Kato

(10) Patent No.: US 8,654,307 B2
(45) Date of Patent: Feb. 18, 2014

(54) SCANNING TYPE EXPOSURE APPARATUS, METHOD OF MANUFACTURING MICRO-APPARATUS, MASK, PROJECTION OPTICAL APPARATUS, AND METHOD OF MANUFACTURING MASK

(75) Inventor: Masaki Kato, Yokohama (JP)

(73) Assignee: Nikon Corporation, Tokyo (JP)

( * ) Notice: Subject to any disclaimer, the term of this patent is extended or adjusted under 35 U.S.C. 154(b) by 645 days.

(21) Appl. No.: 11/723,124

(22) Filed: Mar. 16, 2007

(65) Prior Publication Data

US 2007/0236676 A1     Oct. 11, 2007

Related U.S. Application Data

(60) Provisional application No. 60/853,452, filed on Oct. 23, 2006.

(30) Foreign Application Priority Data

Mar. 20, 2006 (JP) ............................... P2006-075853
Oct. 13, 2006 (JP) ............................... P2006-279388

(51) Int. Cl.
*G03B 27/44* (2006.01)
*G03B 27/42* (2006.01)
*G03B 27/52* (2006.01)
*G03B 27/32* (2006.01)
*G03B 27/54* (2006.01)

(52) U.S. Cl.
USPC ................... 355/46; 355/53; 355/55; 355/66; 355/67; 355/77

(58) Field of Classification Search
USPC ........... 355/46, 52, 53, 55, 63, 62, 66, 67–71, 355/77, 75; 250/492.1, 492.2, 492.22, 548; 430/5, 8, 22, 311, 312
See application file for complete search history.

(56) References Cited

U.S. PATENT DOCUMENTS 5,581,075 A * 12/1996 Naraki et al. ............... 250/205
5,625,436 A *  4/1997 Yanagihara et al. ......... 355/53
5,729,331 A *  3/1998 Tanaka et al. ............... 355/53

(Continued)

FOREIGN PATENT DOCUMENTS

| CN | 1719339 A | 1/2006 |
| JP | A-07-183212 | 7/1995 |
| JP | A 9-134870 | 5/1997 |
| JP | A-11-265848 | 9/1999 |
| JP | A-2004-014728 | 1/2004 |
| JP | A-2005-316409 | 11/2005 |
| JP | A-2005-332987 | 12/2005 |
| JP | A 2005-340605 | 12/2005 |
| JP | A-2006-047958 | 2/2006 |

OTHER PUBLICATIONS

Sep. 1, 2010 Office Action issued in Chinese Patent Application No. 200780005789.8 with English translation.
Japanese Office Action issued in Japanese Application No. JP-2006-279388 dated Jul. 19, 2011 with English translation.

*Primary Examiner* — Toan Ton
*Assistant Examiner* — Christina Riddle
(74) *Attorney, Agent, or Firm* — Oliff PLC

(57) ABSTRACT

It is disclosed a mask on which a pattern for transfer is formed. The mask comprising a first row pattern part and a second row pattern part which are arranged along a first direction on the mask. The whole region of the first row pattern part and the whole region of the second row pattern part region are arranged to deviate from each other by a predetermined amount in a second direction perpendicular to the first direction.

20 Claims, 14 Drawing Sheets

(56) References Cited

U.S. PATENT DOCUMENTS

| | | |
|---|---|---|
| 5,903,400 A | 5/1999 | Endo |
| 5,999,244 A * | 12/1999 | Yanagihara et al. ............ 355/53 |
| 6,195,153 B1 * | 2/2001 | Shimizu .......................... 355/53 |
| 6,512,573 B2 | 1/2003 | Fürter |
| 2001/0052966 A1 * | 12/2001 | Fujitsuka et al. ............... 355/53 |
| 2003/0227536 A1 | 12/2003 | Nakai |
| 2003/0227607 A1 * | 12/2003 | Kato et al. ...................... 355/53 |
| 2005/0213071 A1 | 9/2005 | Fukuda |
| 2006/0018560 A1 | 1/2006 | Kitagawa et al. |
| 2008/0013061 A1 * | 1/2008 | Kato ............................... 355/53 |

* cited by examiner

Fig.12
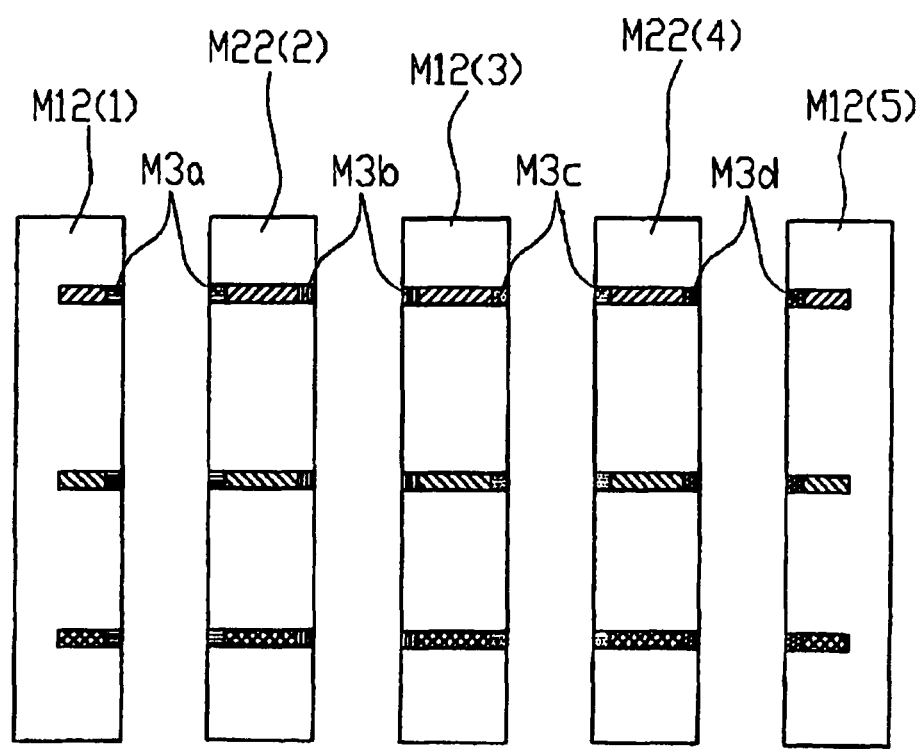
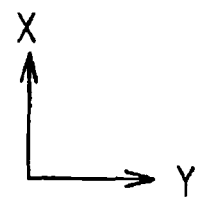

*Fig.13*
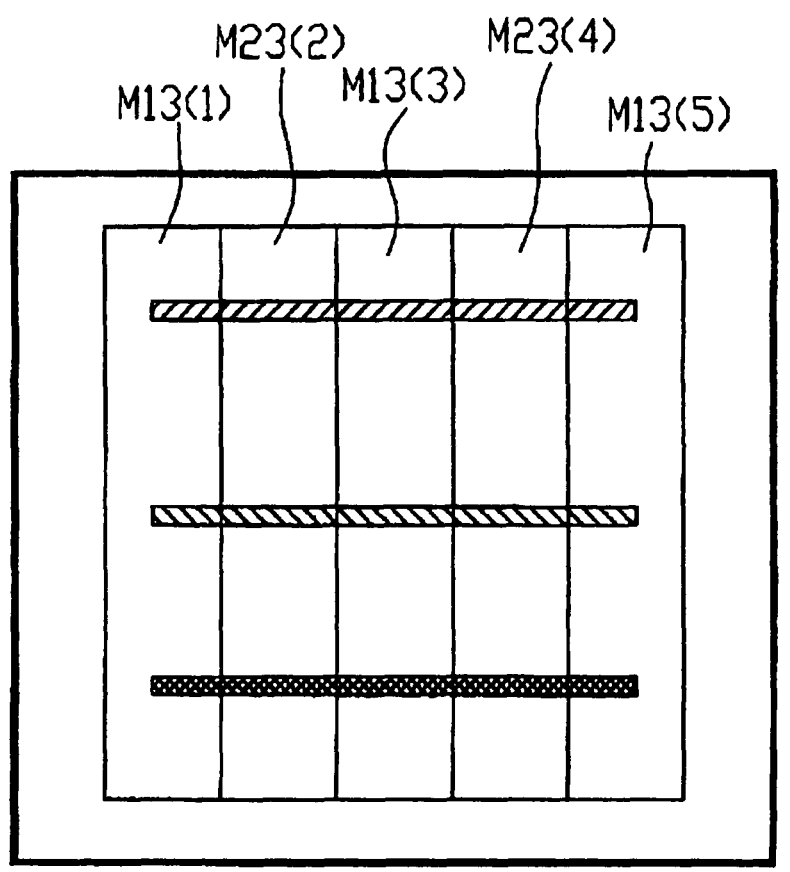
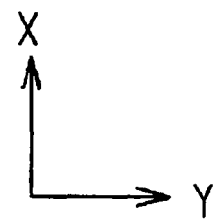

SCANNING TYPE EXPOSURE APPARATUS, METHOD OF MANUFACTURING MICRO-APPARATUS, MASK, PROJECTION OPTICAL APPARATUS, AND METHOD OF MANUFACTURING MASK

CROSS-REFERENCE TO RELATED APPLICATIONS

This application is based upon and claims the benefit of priorities from U.S. Provisional Application No. 60/853,452, filed on Oct. 23, 2006, Japanese Patent Application No. 2006-075853 filed on Mar. 20, 2006, and Japanese Patent Application No. 2006-279388 filed on Oct. 13, 2006, the entire contents of which are incorporated herein by reference.

BACKGROUND

1. Field

One embodiment of the present invention relates to a scanning type exposure apparatus which projects and exposes an image of a first object (such as a mask and a reticle) on a second object (such as a substrate), a method of manufacturing a micro-device by using the scanning type exposure apparatus, a mask used for the scanning type exposure apparatus, a projection optical apparatus which projects the image of the first object on the second object, and a method of manufacturing the mask used for the scanning type exposure apparatus.

2. Description of the Related Art

For example, when a semiconductor device or a liquid crystal display device is manufactured, there is used a projection exposure apparatus which projects a pattern of a mask (such as a reticle and a photomask) on a plate (such as a glass plate and a semiconductor wafer) coated with photo-resist via a projection optical system. Conventionally, a projection exposure apparatus (stepper) which collectively exposes each pattern of reticle onto each shot region on the plate by the step and repeat system, has been frequently used. In recent years, instead of using one large projection optical system, there is proposed a step-and-scan type projection exposure apparatus in which a plurality of small partial projection optical systems comprising unit magnification are arranged in a plurality of rows at a predetermined interval along a scanning direction, and which exposes a pattern of a mask on a plate by the respective partial projection optical systems while scanning the mask and the plate.

In the above described step-and-scan type projection exposure apparatus, an intermediate image of a pattern on a mask is once formed by a catadioptric optical system constituted by including a reflecting prism, a concave mirror, and respective lenses, and the intermediate image is then exposed once more by a catadioptric optical system of another stage so that an unmagnified(unit) erecting image of the pattern on the mask is formed on a plate.

In recent years, a plate has been increasingly enlarged, and a plate comprising a size exceeding 2 m square has been used. Here, when a large-sized plate is exposed by using the above described step-and-scan type exposure apparatus, the size of a mask is also increased because the partial projection optical system has unit magnification. As the size of a mask is increased, the planarity of the mask substrate also needs to be maintained, which results in a further increase in the cost of the mask. Masks corresponding to four to five layers are needed in order to form an ordinary TFT part, and hence a large cost is required. It is disclosed by, for example, U.S. Pat. No. 6,512,573, a projection exposure apparatus which is capable of reducing the size of a mask by adopting enlargement magnification as the magnification of the projection optical system.

SUMMARY

Embodiments of the present invention show a scanning type exposure apparatus mounted with an inexpensive projection optical system comprising enlargement projection magnification, a manufacturing method of a micro-device using the scanning type exposure apparatus, a mask used for the scanning type exposure apparatus, and a manufacturing method of the mask used for an inexpensive projection optical apparatus comprising the enlargement projection magnification and the scanning type exposure apparatus.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A scanning type exposure apparatus according to an embodiment of the present invention, which transfer-exposes a pattern of a first object onto a second object by using a first projection optical system arranged on a first side in a scanning direction and a second projection optical system arranged on a second side in the scanning direction, while changing relative positional relations of the first object and the second object with respect to the first projection optical system and the second projection optical system in the scanning direction, wherein an enlargement image in a field of view on the first object is formed in an image field on the second object by each of the fir projection optical system and the second projection optical system, and wherein when an interval in the scanning direction between centers of the field of views of the first projection optical system and the second projection optical system is set as Dm, an interval in the scanning direction between centers of the image fields formed by the first projection optical system and the second projection optical system is set as Dp, and projection magnification of each of the first projection optical system and the second projection optical system is set as $\beta$, a condition: $Dp < Dm \times |\beta|$ (however, $|\beta| > 1$) is satisfied.

A manufacturing method of a micro-device according to an embodiment of the present invention, including an exposure step of exposing a pattern of a mask on a photosensitive substrate by using the scanning type exposure apparatus according to the present invention; and a developing step of developing the photosensitive substrate exposed by the exposure step.

A mask according to an embodiment of the present invention, on which a pattern for transfer is formed, comprising first row pattern parts and second row pattern parts which are arranged along a first direction on the mask, and in that the whole region of the first row pattern parts and the whole region of the second row pattern parts are arranged so as to deviate from each other by a predetermined amount in a second direction perpendicular to the first direction.

Further, a projection optical apparatus according to an embodiment of the present invention, which forms an enlargement image of a first object on a second object, comprising a first imaging optical system which forms an intermediate image of the first object, and a second imaging optical system which optically conjugates the intermediate image with the second object, and in that one of the first imaging optical system and the second imaging optical system has nearly unit projection magnification, and the other optical system has enlargement projection magnification, and an optical characteristic adjusting mechanisms are provided in an optical path of the optical system comprising the nearly unmagnified projection magnification (unit magnification).

A mask according to an embodiment of the present invention, comprising a pattern part, wherein the pattern part includes odd-numbered row pattern parts in odd rows and even-numbered row pattern parts in even rows along a first direction, in that among the odd-numbered row pattern parts and the even-numbered row pattern parts, at least one adjacent pair of the odd-numbered row pattern part and the even-numbered row pattern part have common regions including a same pattern, at the end of each pattern in the first direction, and in that the whole region of the odd-numbered row pattern parts and the whole region of even-numbered row pattern parts are arranged so as to deviate from each other by a predetermined amount in a second direction perpendicular to the first direction.

Further, a manufacturing method of a mask according to an embodiment of the present invention including a step of dividing, in a first direction, pattern data corresponding to a whole pattern formed on the mask, a step of creating drawing data by adding pattern data corresponding to common regions, to the end of at least one of the divided regions in the first direction, and a step of drawing a pattern on the mask so as to make the patterns deviate by a predetermined amount in a second direction, by using the drawing data corresponding to the respective divided regions.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 12 is a figure for explaining the manufacturing method of the mask (for the erecting image) according to the present embodiment;

FIG. 13 is a figure for explaining a manufacturing method of the mask (for the inverted image) according to the present embodiment.

EXPLANATION OF SYMBOLS

DETAILED DESCRIPTION

In the following, a first embodiment according to the present invention will be explained with reference to the accompanying drawings. In the present embodiment, a projection optical system apparatus PL which consists of a plurality of catadioptric type projection optical systems PL1 to PL7 each of which partially projects a part of a pattern of a mask (first object) M onto a plate (second object) P comprising an outer diameter of 500 mm or more as a photosensitive substrate, is explained by exemplifying a scanning type projection exposure apparatus of a step-and-scan system which makes an image of the pattern formed on the mask M scanned and exposed onto the plate P by moving the mask M and the plate P synchronously with each other in the scanning direction. Here, the fact that the outer diameter is larger than 500 mm means that one side or a diagonal is larger than 500 mm.

Figure 1:
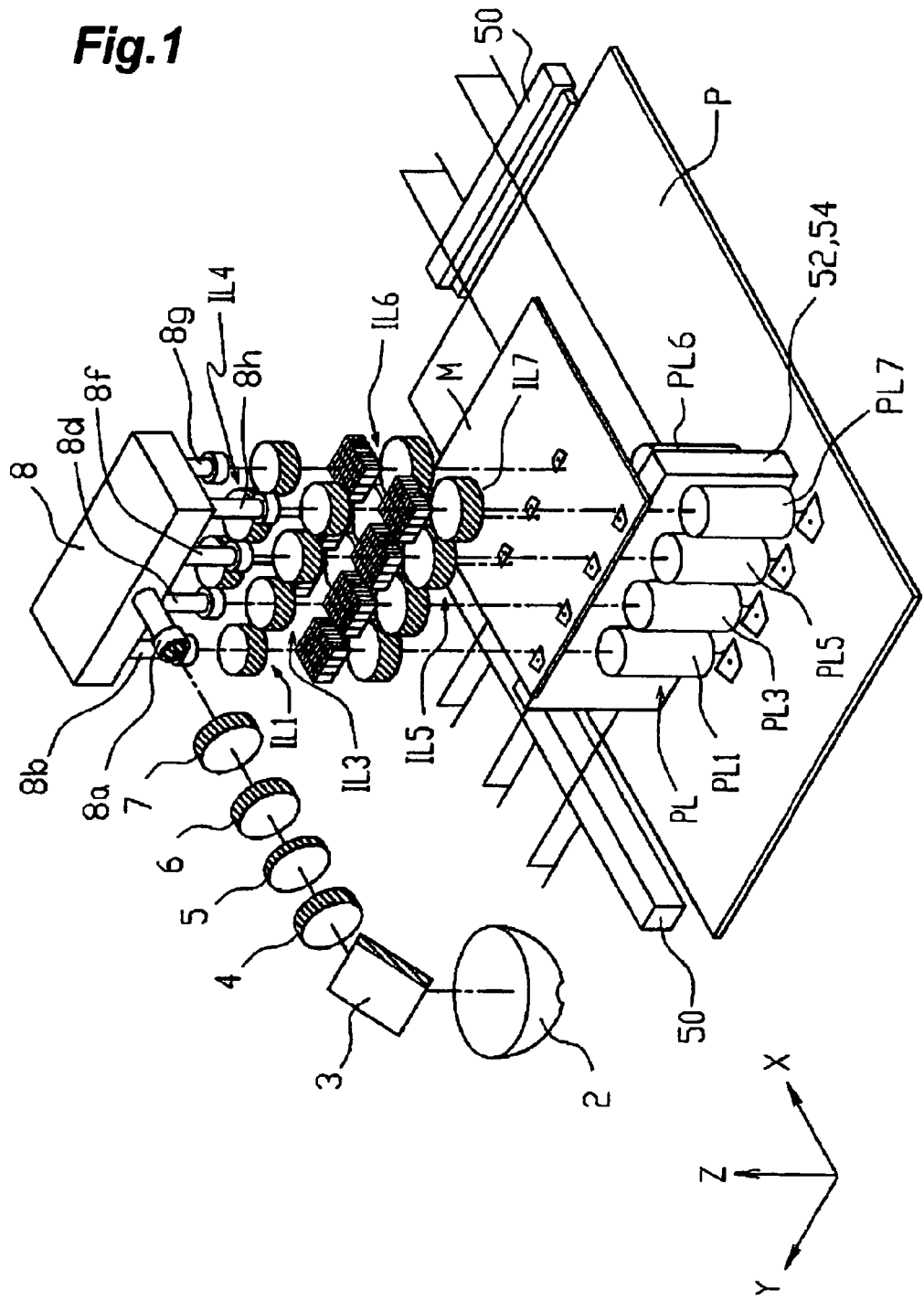
FIG. 1 is a figure showing a constitution of a scanning type exposure apparatus according to a first embodiment.

FIG. 1 is a perspective view schematically showing a scanning type projection exposure apparatus according to the present embodiment. The scanning type projection exposure apparatus according to the present embodiment is provided, for example, with a light source having an ultra-high pressure mercury lamp light source. A light beam emitted from the light source is reflected by an elliptic mirror 2 and a dichroic mirror 3, so as to be made incident on a collimator lens 4. That is, the light in wavelength regions including g-line (wavelength of 436 nm), h-line (wavelength of 405 nm), and i-line (wavelength of 365 nm) is taken out by the reflective film of the elliptic mirror 2 and the reflective film of the dichroic mirror 3, so that the light in the wavelength regions including the light of g-, h- and i-lines is made incident on the collimator lens 4. Further, since the light source is arranged in a first focal position of the elliptic mirror. 2, the light in the wavelength regions including the light of g-, h- and i-lines, forms a light source image in a second focal position of the elliptic mirror 2. A divergent light beam from the light source image formed in the second focal position of the elliptic mirror 2 is made into parallel light beams by the collimator lens 4, so as to pass through a wavelength selection filter 5 which transmits only a light beam in a predetermined exposure wavelength region.

The light beam, after passing through the wavelength selection filter 5, passes through an attenuate filter 6, and is converged on an incidence port 8a of a light guide fiber 8 by a condenser lens 7. Here, the light guide fiber 8 is, for example, a random light guide fiber which is constituted by randomly bundling a number of optical fibers, and has the incidence port 8a and seven emission ports (hereinafter referred to as emission ports 8b, 8c, 8d, 8e, 8f, 8g and 8h). The light beam incident on the incidence port 8a of the light guide fiber 8 is propagated through the inside of the light guide fiber 8, and thereafter, is divided and emitted by the seven emission ports 8b to 8h, so as to be respectively made incident on seven partial illumination optical systems (hereinafter referred to as partial illumination optical systems IL1, IL2, IL3, IL4, IL5, IL6 and IL7) which partially illuminate the mask M.

The light beam emitted from the emission port 8b of the light guide fiber 8 is made incident on the partial illumination optical system IL1, so as to be made into parallel light beams by a collimator lens arranged in the vicinity of the emission port 8b. The light beam converged by the collimator lens is made incident on a fly's-eye lens which is an optical integrator. The light beam from a number of secondary light sources formed on a rear side focal plane of the fly's-eye lens substantially uniformly illuminates the mask M through the condenser lens. Note that the partial illumination optical systems IL2 to IL7 have the same constitution as the partial illumination optical system IL1, and substantially uniformly illuminate the mask M through the condenser lenses of the respective partial illumination optical systems IL2 to IL7.

Light from the illumination region of the mask M, that is, the illumination region corresponding to the partial illumination optical system IL1, is made incident on the projection optical system PL1 among seven projection optical systems (hereinafter referred to as projection optical systems PL1, PL2, PL3, PL4, PL5, PL6 and PL7) which are arranged so as to correspond to the respective illumination regions, and project a partial image of the pattern of the mask M onto the plate P, respectively. The light transmitted through the projection optical system PL1 forms a pattern image of the mask M on the plate P. Note that light beams from the illumination regions corresponding to the partial illumination optical systems IL2 to IL7 are respectively made incident on the projection optical systems PL2 to PL7 which are arranged so as to correspond to the respective illumination regions, and project partial images of the pattern of the mask M onto the plate P. The light beams transmitted through the projection optical systems PL2 to PL7 form pattern images of the mask M on the plate P, respectively.

Here, the mask M is fixed to a mask holder (not shown) so as to be mounted on a mask stage (not shown). Further, a laser interferometer (not shown) is arranged on the mask stage, and the mask stage laser interferometer measures and controls the position of the mask stage. Further, the plate P is fixed to a plate holder (not shown), so as to be mounted on a plate stage (not shown). Further, a moving mirror 50 is provided on the plate stage. A laser beam emitted from a plate stage laser interferometer (not shown) is incident on and reflected from the moving mirror 50. The position of the plate stage is measured and controlled on the basis of the interference between the incident and reflected laser beams.

The above described partial illumination optical systems IL1, IL3, IL5 and IL7 are arranged as a first row on the second side in the scanning direction at a predetermined interval in the direction perpendicular to the scanning direction. Similarly, the projection optical systems PL1, PL3, PL5 and PL7, which are provided so as to correspond to the partial illumination optical systems IL1, IL3, IL5 and IL7, are also arranged as the first row on the second side in the scanning direction at a predetermined interval in the direction perpendicular to the scanning direction. Further, the partial illumination optical systems IL2, IL4 and IL6 are arranged as the second row on the first side in the scanning direction at a predetermined interval in the direction perpendicular to the scanning direction. Similarly, the projection optical systems PL2, PL4 and PL6, which are provided so as to correspond to the partial illumination optical systems IL2, IL4 and IL6, are also arranged as the second row on the first side in the scanning direction at a predetermined interval in the direction perpendicular to the scanning direction. Between the projection optical systems of the first row and the projection optical system of the second row, there are arranged an off-axis alignment system 52 for positioning the plate P and an autofocus system 54 for adjusting the focus on the mask M and the plate P.

Figure 2:
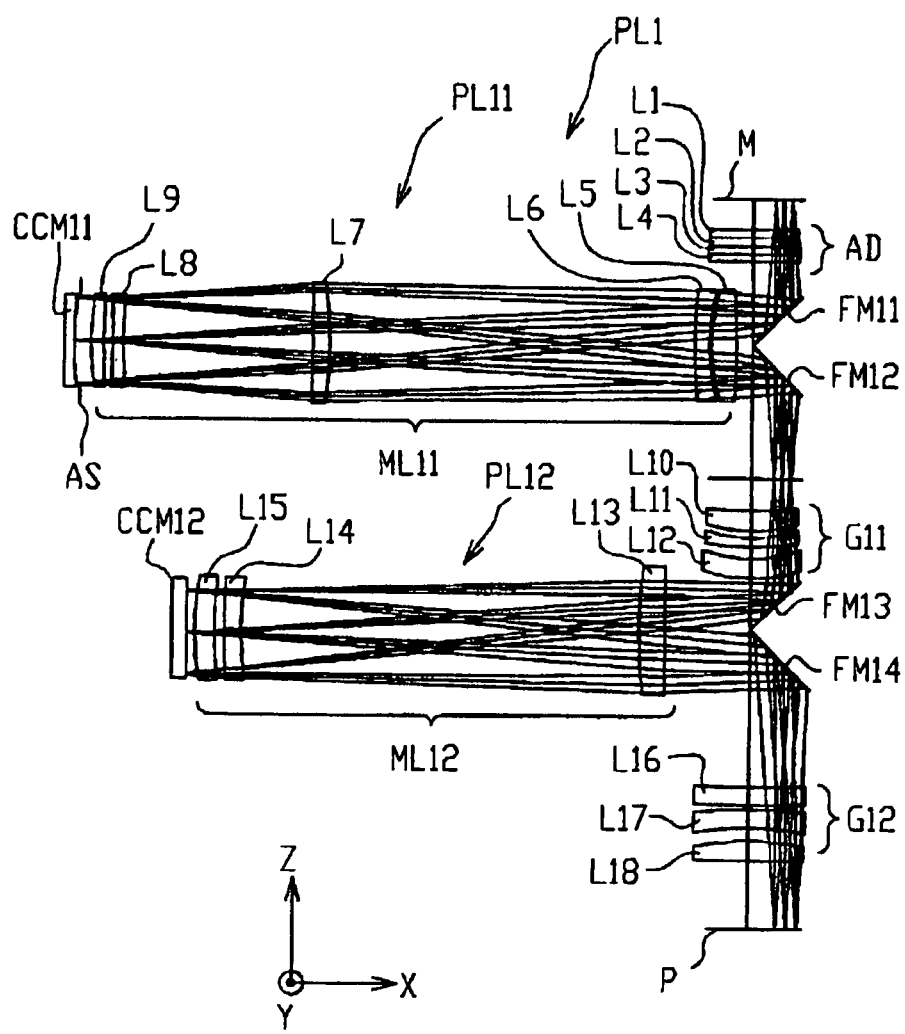
FIG. 2 is a figure showing a constitution of a projection optical system according to the first embodiment.

FIG. 2 is a figure showing a constitution of the projection optical system PL1. Note that the projection optical systems PL2 to PL7 have the same constitution as the projection optical system PL1. The projection optical system PL1 is a projection optical system which makes an enlargement image in a field of view on the mask M formed in an image field on the plate P. That is, the projection optical system PL1 is provided with a first imaging optical system PL11 which forms an intermediate image of the mask M and has nearly unmagnified projection magnification (unit magnification), and with a second imaging optical system PL12 which optically conjugates the intermediate image with the plate P and has enlargement projection magnification.

The first imaging optical system PL11 is provided with a concave reflecting mirror CCM11 arranged in the optical path between the mask M and the intermediate image, an optical characteristic adjusting mechanism AD arranged in the optical path between the mask M and the concave reflecting mirror CCM11, a first optical path deflection surface FM11 which is obliquely provided at an angle of 45° with respect to the surface of the mask M in the optical path between the optical characteristic adjusting mechanism AD and the concave reflecting mirror CCM11 so as to deflect the optical path in such a manner that the light propagating in the −Z axis direction from the optical characteristic adjusting mechanism AD is reflected in the −X axis direction, a first main lens group ML11 constituted by at least one lens arranged in the optical path between the first optical path deflection surface FM11 and the concave reflecting mirror CCM11, and a second optical path deflection surface FM12 which is obliquely provided at an angle of 45° with respect to the surface of the mask M in the optical path between the first main lens group ML11 and the intermediate image so as to deflect the optical path in such a manner that the light propagating in the X axis direction from the first main lens group ML11 is reflected in the −Z axis direction. Note that an aperture diaphragm AS is provided in the vicinity of the concave reflecting mirror CCM11 (pupil position).

Here, the optical characteristic adjusting mechanism AD includes parallel plates L1, L2, L3 and L4. The first main lens group ML11 is constituted by a biconvex lens L5, a negative meniscus lens L6 facing its convex surface to the side of the concave reflecting mirror CCM11, a biconvex lens L7, a biconcave lens L8, and a positive meniscus lens L9 facing its convex surface to the side of the concave reflecting mirror CCM11.

The second imaging optical system PL12 is provided with a concave reflecting mirror CCM12 which is arranged in the optical path between the intermediate image and the plate P, a first lens group G11 which is arranged in the optical path between the intermediate image and the concave reflecting mirror CCM12 and contributes to enlargement, a third optical path deflection surface FM13 which is obliquely provided at an angle of 45° with respect to the surface of the mask M in the optical path between the first lens group G11 and the concave reflecting mirror CCM12 so as to deflect the optical path in such a manner that the light propagating in the −Z axis direction from the first lens group G11 is reflected in the −X axis direction, a second main lens group L12 which is arranged in the optical path between the third optical path deflection surface FM13 and the concave reflecting mirror CCM12, a fourth optical path deflection surface FM14 which is obliquely provided at an angle of 45° with respect to the surface of the mask M in the optical path between the second main lens group L12 and the plate P so as to deflect the optical path in such a manner that the light propagating in the X axis direction from the second main lens group L12 is reflected in the −Z axis direction, and a second lens group G12 which is arranged in the optical path between the fourth optical path deflection surface FM14 and the plate P and contributes to enlargement.

Here, the first lens group G11 of the second imaging optical system PL12 is constituted by a positive meniscus lens L10 facing its convex surface to the side of the third optical path deflection surface FM13, a negative meniscus lens L11 facing its convex surface to the side of the third optical path deflection surface FM13, and a positive meniscus lens L12 facing its convex surface to the side of the third optical path deflection surface FM13. Further, the second main lens group ML12 is constituted by a biconvex lens L13, a negative meniscus lens L14 facing its concave surface to the side of the third optical path deflection surface FM13, and a negative meniscus lens L15 facing its concave surface to the side of the third optical path deflection surface FM13. Further, the second lens group G12 is constituted by a negative meniscus lens L16 facing its concave surface to the side of the fourth optical path deflection surface FM14, a negative meniscus lens L17 facing its convex surface to the side of the fourth optical path deflection surface FM14, and a biconvex lens L18.

Figure 3:
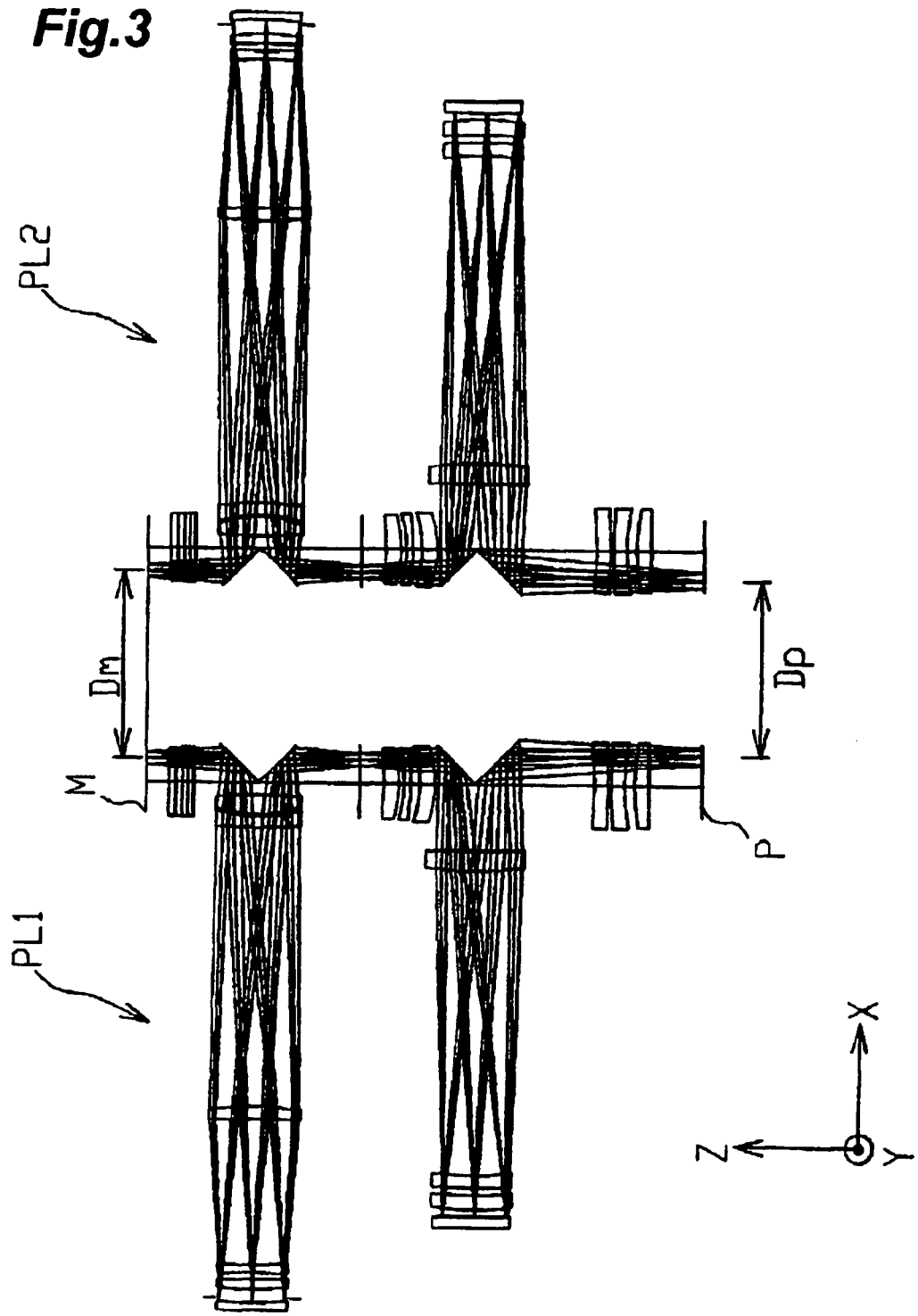
FIG. 3 is a figure showing a constitution of a projection optical system according to the first embodiment.

FIG. 3 is a figure showing the projection optical systems PL1 and PL2 of the projection optical apparatus PL seen from the non-scanning direction (Y axis direction). When an interval in the scanning direction (X axis direction) between centers of the field of views of the projection optical system PL1 and the projection optical system PL2 is set as Dm, an interval in the scanning direction (X axis direction) between centers of the image fields formed by the projection optical system PL1 and the second projection optical system PL2 is set as Dp, and the projection magnification of each of the projection optical system PL1 and the projection optical system PL2 is set as β, a condition: Dp<Dm×|β| (however, |β|>1) is satisfied.

Figure 4:
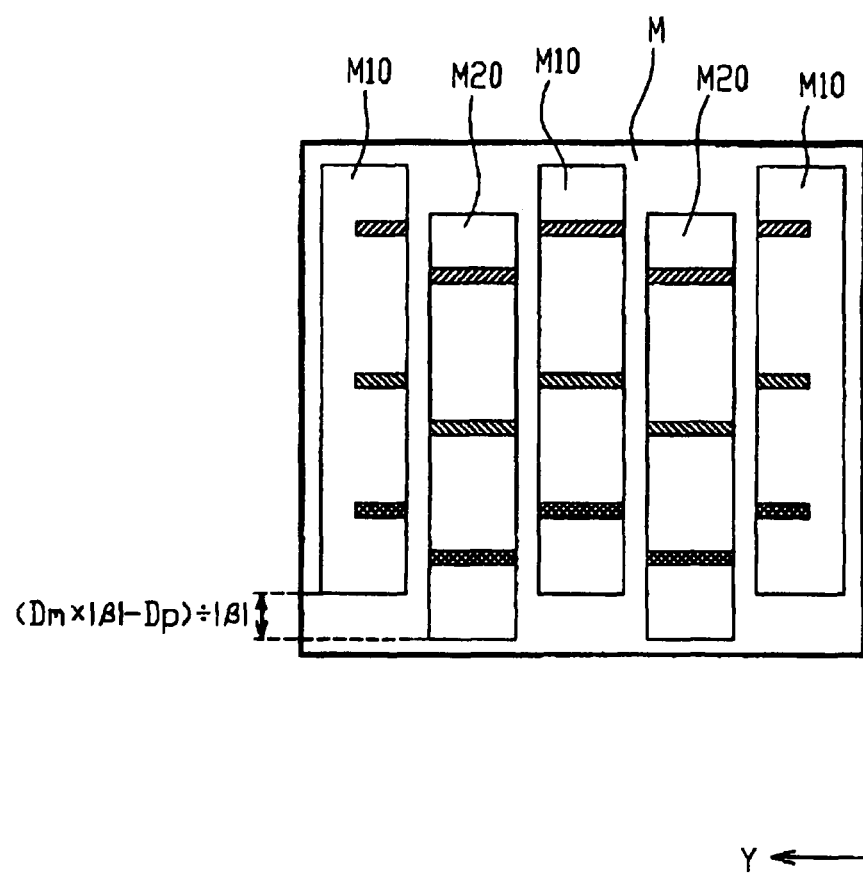
FIG. 4 is a figure showing a constitution of a mask used for the scanning type exposure apparatus according to the first embodiment.

FIG. 4 is a figure showing a constitution of a mask used for the scanning type exposure apparatus according to the present embodiment. Note that in FIG. 4, there is shown a mask used for a scanning type exposure apparatus provided with a projection optical apparatus which forms an erecting image, and in which three projection optical systems (hereinafter referred to as second side projection optical system) are arranged on the second side (−X axis direction) in the scanning direction at a predetermined interval along the non-scanning direction, and two projection optical systems (hereinafter referred to as first side projection optical system) are arranged on the first side (X axis direction) in the scanning direction at a predetermined interval along the non-scanning direction.

As shown in FIG. 4, the mask M is provided with first row pattern parts M10 and second row pattern parts M20 which are arranged in the non-scanning direction (Y axis direction). Here, the whole region of the first row pattern parts M10 and the whole region of the second row pattern parts M20 are arranged so as to deviate from each other by a predetermined amount in the scanning direction (X axis direction).

Here, field of views of the second side projection optical system of the projection optical apparatus are positioned in the first row pattern parts M10, and field of views of the first side projection optical system of the projection optical apparatus are positioned in the second row pattern parts M20. In this mask M, when an interval in the scanning direction between the centers of the field of views of the second side projection optical system and the first side projection optical system is set as Dm, an interval in the scanning direction between the centers of the image fields formed by the second side projection optical system and the fit side projection optical system is set as Dp, and the projection magnification of each of the second side projection optical system and the first side projection optical system is set as β, the predetermined amount is given by (Dm×|β|−Dp)/|β|.

Figure 5:
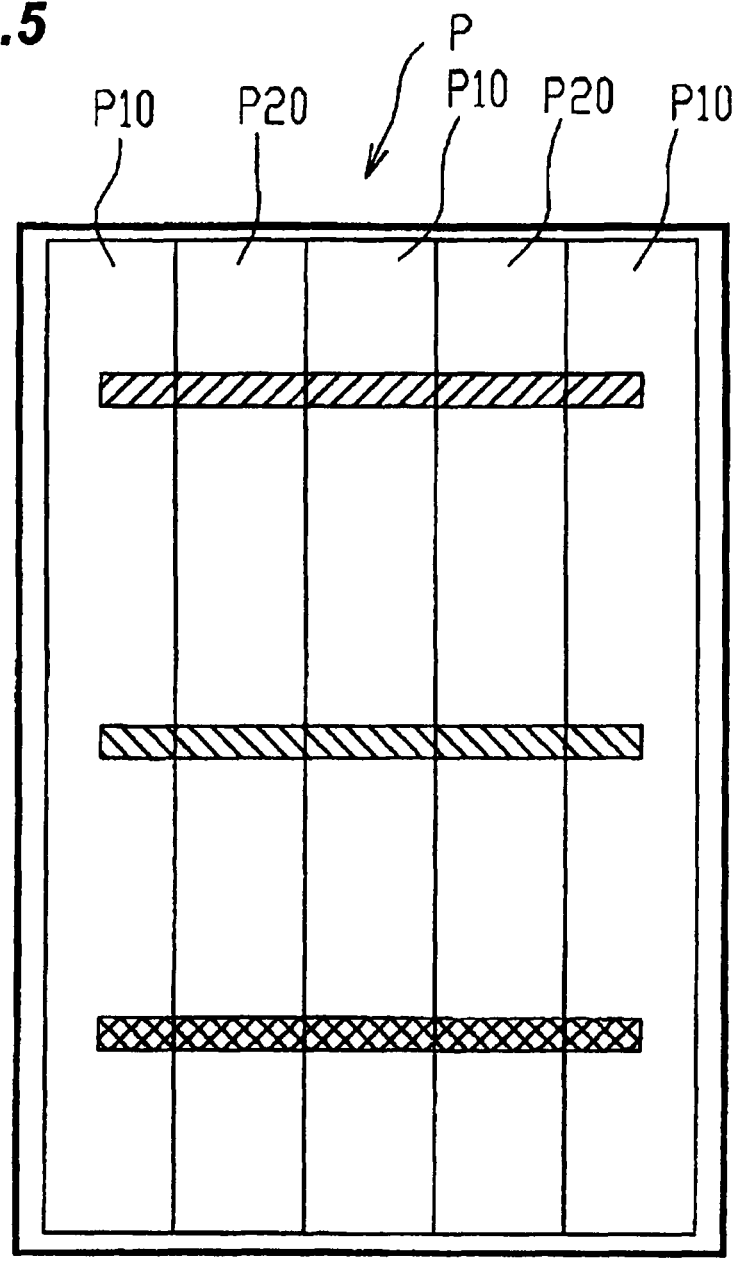
FIG. 5 is a figure showing a state where a pattern of a mask is transfer-exposed onto a plate by the scanning type exposure apparatus according to the first embodiment.

When the pattern of this mask M is transfer-exposed onto the plate P, the first row pattern parts M10 on the mask M are transfer-exposed onto first pattern transfer regions P10 (see FIG. 5) on the plate P by using the second side projection optical system, and the second row pattern parts M20 on the mask M are transfer-exposed onto second pattern transfer regions P20 on the plate P by using the first side projection optical system. FIG. 5 shows a state where the pattern of the mask M is transfer-exposed onto the plate P by using the scanning type exposure apparatus according to the present embodiment. In this scanning type exposure apparatus, since the projection optical apparatus has enlargement projection magnification, the first row pattern part M10 and the second row pattern part M20 which are formed on the mask M at a predetermined interval in the non-scanning direction, are transfer-exposed onto the plate P in such a manner that the first pattern transfer region P10 and the second pattern transfer region P20 are partially overlapped with each other in the non-scanning direction. Note that in this case, it is preferred to make the overlapped part of the first pattern transfer region P10 and the second pattern transfer region P20 in the non-scanning direction hardly seen by forming the illumination field of view into a trapezoidal shape and the like. In this case, it is preferred to provide a field stop in the illumination system.

Further, the projection optical apparatus of the scanning type exposure apparatus according to the present embodiment has the enlargement projection magnification, but makes the interval between the centers of the image fields of the second side projection optical system and the first side projection optical system in the scanning direction (X axis direction), smaller than the distance obtained by multiplying the interval between the centers of the field of views of the second side projection optical system and the first side projection optical system in the scanning direction (X axis direction) by the enlargement projection magnification. However, the position of the first row pattern part M10 in the scanning direction in which the field of view of the second side projection optical system is positioned, and the position of the second row pattern part M20 in the scanning direction in which the field of view of the first side projection optical system of the projection optical apparatus is positioned, are arranged so as to deviate from each other in the scanning direction by a distance corresponding to the enlargement projection magnification. Thereby, the first pattern transfer region P10 and the second pattern transfer region P20 are transfer-exposed onto the plate in such a manner that the end positions of both the transfer regions in the scanning direction are coincident with each other.

Therefore, with this scanning type exposure apparatus, even in the case where a pattern of a mask is transferred onto a large-sized plate, it is possible to avoid a further increase in the size of the mask only by extending the length of the mask in the scanning direction by the distance at which the first row pattern part and the second row pattern part are arranged so as to deviated from each other. Further, in spite of the fact that the projection optical system has the enlargement magnification, it is not necessary to extend the interval in the scanning direction between the centers of the image fields formed by the second side projection optical system and the first side projection optical system, with respect to the interval in the scanning direction between the centers of the field of views of the second side projection optical system and the first side projection optical system, as a result of which it is possible to increase the degree of freedom in designing the projection optical system and to reduce the production cost.

In contrast, if the respective projection optical systems are arranged so as to make the enlargement magnification effected by the whole multi-lens system, that is, the positions in the scanning direction projected by the respective projection optical systems are made to deviate by an amount corresponding to the magnification, when the projection magnification is set to 1.25, and the interval of the field of views on the mask side of the projection optical system is set to 200 mm, the interval of the image fields on the plate side of the projection optical system needs to be set to 250 mm, which is 1.25 times the interval of the field of views on the mask side of the projection optical system, for example. These case brings about decrease the degree of freedom in designing the projection optical system and to increase in the production cost.

Figure 6:
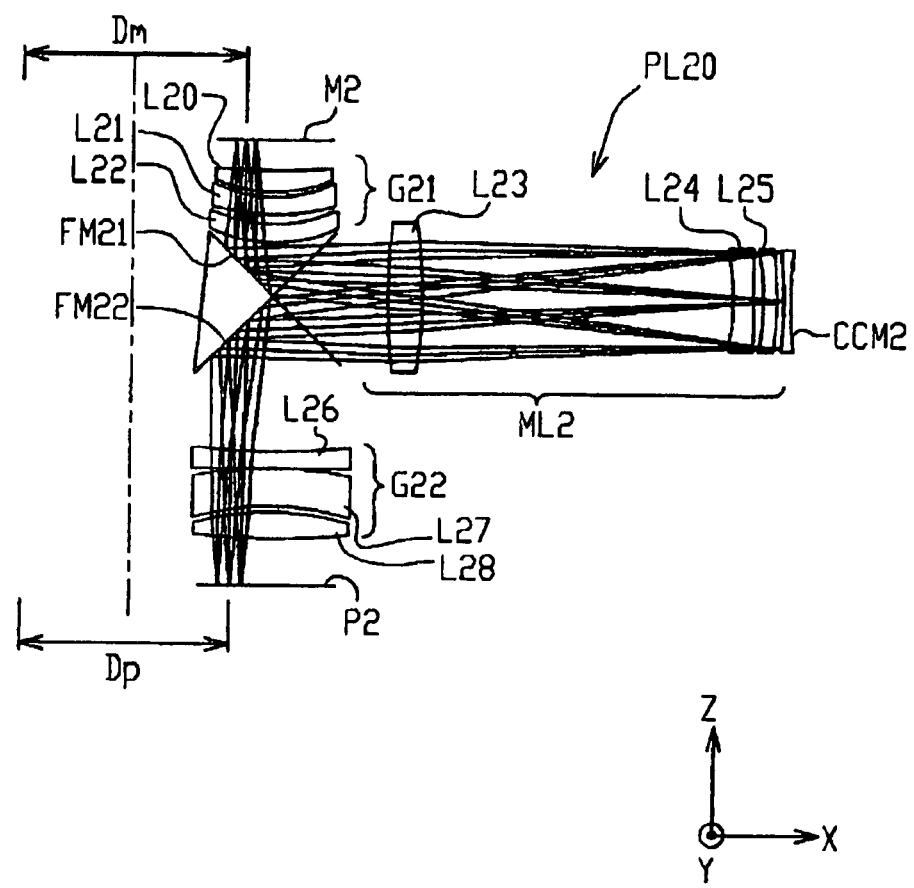
FIG. 6 is a figure showing a constitution of a projection optical system provided for a scanning type exposure apparatus according to a second embodiment.

Next, a scanning type exposure apparatus according to a second embodiment of the present invention is explained. In the scanning type exposure apparatus according to the second embodiment, a projection optical apparatus provided with seven projection optical systems as shown in FIG. 6 is used as a projection optical system constituting the projection optical apparatus. The scanning type exposure apparatus according to the second embodiment is the same as the scanning type exposure apparatus according to the first embodiment in other respects.

A projection optical system PL20 is a projection optical system which makes enlargement image in a field of view on a mask M2 formed in an image field on a plate P2. The projection optical system PL20 includes a concave reflecting mirror CCM2 arranged in the optical path between the mask M2 and the plate P2, a first lens group G21 which is arranged in the optical path between the mask M2 and the concave reflecting mirror CCM2 and contributes to enlargement, a first optical path deflection surface FM21 which is obliquely provided with respect to the surface of the mask M2 in the optical path between the first lens group G21 and the concave reflecting mirror CCM2, so as to make the light propagating in the –Z axis direction from the first lens group G21 reflected in the X axis direction, a main lens group ML2 which is arranged in the optical path between the first optical path deflection surface FM21 and the concave reflecting mirror CCM2, a second optical path deflection surface FM22 which is obliquely provided with respect to the surface of the mask M2 in the optical path between the main lens group ML2 and the plate P2, so as to make the light propagating in the –X axis direction from the main lens group ML2 reflected in the –Z axis direction, and a second lens group G23 which is arranged in the optical path between the second optical path deflection surface FM22 and the plate P2, and forms an inverted image of the pattern of the mask M2 on the plate P2.

Here, the first lens group G21 is constituted by a positive meniscus lens L20 facing its concave surface to the mask M2, a negative meniscus lens L21 facing its concave surface to the mask M2, and a positive meniscus lens L22 facing its concave surface to the mask M2. The main lens group ML2 is constituted by a biconvex lens L23, a negative meniscus lens L24 facing its convex surface to the side of the concave reflecting mirror CCM2, and a positive meniscus lenses L25 facing its convex surface to the side of the concave reflecting mirror CCM2. The second lens group L22 is constituted by a negative meniscus lens L26 facing its convex surface to the side of the plate P2, a negative meniscus lens L27 facing its concave surface to the side of the plate P2, and a biconvex lens 128.

In the projection optical apparatus provided with the projection optical system PL20, in the case where the projection optical system PL20 is used as the first side projection optical system arranged on the first side in the scanning direction, when an interval in the scanning direction (X axis direction) between the centers of the field of views of the first side projection optical system PL20 and the second side projection optical system (not shown) arranged on the second side in the scanning direction is set as Dm, an interval in the scanning direction (X axis direction) between the centers of the image fields formed by the first side projection optical system PL20 and the second side projection optical system is set as Dp, and projection magnification of each of the first side projection optical system PL20 and the second side projection optical system is set as $\beta$, a condition: $Dp<Dm\times|\beta|$ (however, $|\beta|>1$) is satisfied.

Figure 7:
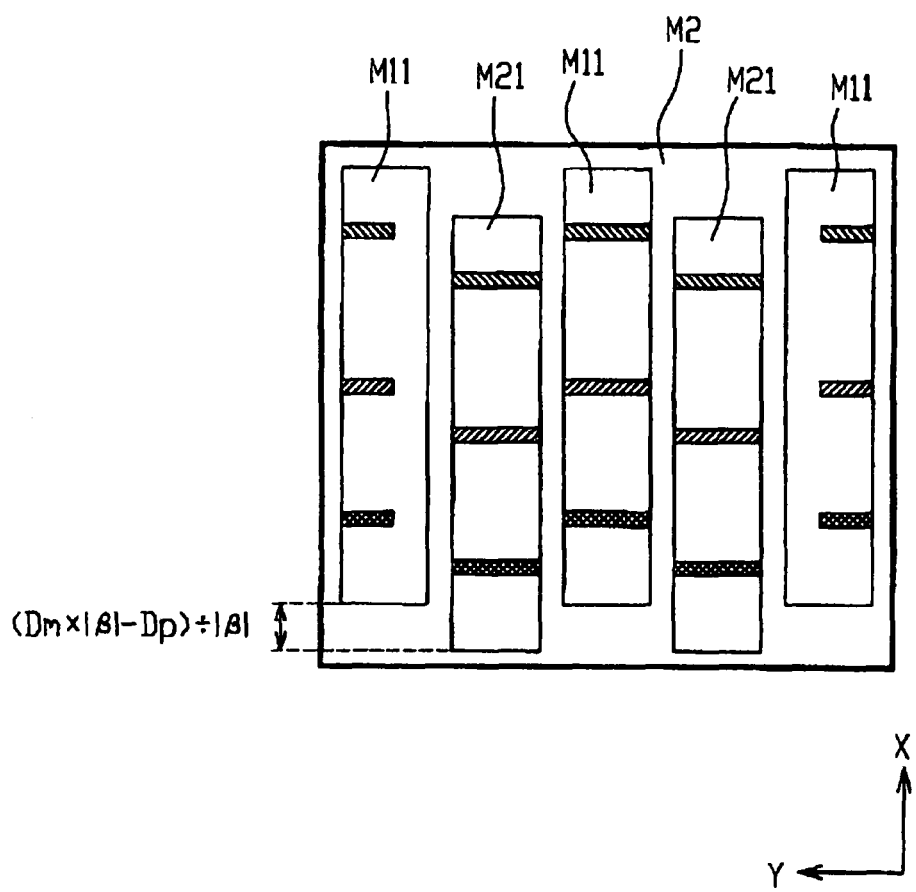
FIG. 7 is a figure showing a constitution of a mask used for the scanning type exposure apparatus according to the second embodiment.

FIG. 7 is a figure showing a constitution of a mask used for the scanning type exposure apparatus according to the present embodiment. Note that in FIG. 7, there is shown a mask used for a scanning type exposure apparatus provided with a projection optical apparatus which forms an inverted image, and in which three second side projection optical systems are arranged at a predetermined interval in the non-scanning direction, and two first side projection optical systems are arranged at a predetermined interval in the non-scanning direction.

As shown in FIG. 7, the mask M2 is provided with first row pattern parts M11 and second row pattern parts M21 which are arranged in the non-scanning direction (Y axis direction). Here, the whole region of the first row pattern parts M11 and the whole region of the second row pattern parts M21 are arranged so as to deviate from each other by a predetermined amount in the scanning direction (X axis direction).

Here, field of views of the second side projection optical system are positioned in the first row pattern parts M11, and field of views of the first side projection optical system are positioned in the second row pattern parts M21. In the mask M2, when an interval in the scanning direction between the centers of the field of views of the second side projection optical system and the first side projection optical system is set as Dm, an interval in the scanning direction between the centers of the image fields formed by the second side projection optical system and the first side projection optical system is set as Dp, and projection magnification of each of the second side projection optical system and the first side projection optical system is set as $\beta$, the predetermined amount is given by $(Dm\times|\beta|-Dp)/|\beta|$.

When the pattern of the mask M2 is transfer-exposed onto the plate P2, the first row pattern parts M11 on the mask M2 are transfer-exposed onto first pattern transfer regions P10 on the plate P2 by using the second side projection optical system, and the second row pattern parts M21 on the mask M2 are transfer-exposed onto second pattern transfer regions P20 on the plate P2 by using the first side projection optical system. FIG. 5 shows a state where the pattern of the mask is transfer-exposed onto the plate by using the scanning type exposure apparatus according to the present embodiment.

In this scanning type exposure apparatus, the first row pattern parts M11 and the second row pattern parts M21 which are formed on the mask M2 at a predetermined interval in the non-scanning direction, are transfer-exposed onto the plate P in an inverted state in the non-scanning direction. In this case, since the projection optical apparatus has the enlargement projection magnification, the first pattern transfer region P10 and the second pattern transfer region P20 are transfer-exposed so as to be partially overlapped with each other in the non-scanning direction on the plate P. Note that in this case, it is preferred to make the part, in which the first pattern transfer region P10 and the second pattern transfer region P20 are overlapped with each other, hardly seen by forming the illumination field into a trapezoidal shape and the like. In this case, it is preferred to provide a field stop in the illumination system.

Further, in the projection optical apparatus of the scanning type exposure apparatus according to the present embodiment, which has the enlargement projection magnification, the interval in the scanning direction (X axis direction) between the centers of the image fields of the second side projection optical system and the first side projection optical system, is made smaller than the distance obtained by multiplying the interval in the scanning direction (X axis direction) between the centers of the field of views of the second side projection optical system and the first side projection optical system by the enlargement projection magnification. However, the position of the first row pattern part M11 in the scanning direction in which the field of view of the second side projection optical system is positioned, and the position of the second row pattern part M21 in the scanning direction in which the field of view of the first side projection optical system of the projection optical apparatus is positioned, are arranged so as to deviate from each other in the scanning direction by a distance corresponding to the enlargement projection magnification. Thereby, the first pattern transfer region P10 and the second pattern transfer region P20 are transfer-exposed onto the plate in such a manner that the end positions of both the transfer regions in the scanning direction are coincident with each other.

Therefore, with this scanning type exposure apparatus, even in the case where a pattern of a mask is transferred onto a large-sized plate, it is possible to avoid a further increase in the size of the mask only by extending the length of the mask in the scanning direction by the distance at which the first row pattern part and the second row pattern part are arranged so as to deviate from each other. Further, in spite of the fact that the projection optical system has the enlargement magnification, it is not necessary to extend the interval in the scanning direction between the centers of the image fields formed by the second side projection optical system and the first side projection optical system, with respect to the interval in the scanning direction between the centers of the field of views of the second side projection optical system and the first side projection optical system, as a result of which it is possible to increase the degree of freedom for designing the projection optical system and to thereby reduce the production cost.

Note that in the above described first embodiment, the first imaging optical system PL11 comprising nearly unmagnified projection magnification (unit magnification) is provided with parallel plates L1 to L4 which constitute the optical characteristic adjusting mechanism AD, but it is possible to shift the image position with respect to the optical axis by making ones of the parallel plates L1 to L4 inclined with respect to the optical axis. Further, it is possible to use a wedge-like pair glass instead of the parallel plates, and to adjust the focus and the image plane inclination by moving the pair glass along the wedge angle and changing the glass thickness. Further, it is possible to adjust the rotation of the image by rotating a prism mirror provided with the first optical path deflection surface FM11 and the second optical path deflection surface FM12. Since the first imaging optical system PL11 has the nearly unmagnified projection magnification (unit magnification), it is possible to adjust the rotational position of the image without generating an aberration change.

Further, in the first imaging optical system PL11 and the first imaging optical system PL12 according to the first embodiment, and in the projection optical system PL20 according to the second embodiment, the number of lenses can be reduced by using the main lens group in a reciprocal (back and forth) manner that both of the light advancing to the concave reflecting mirror and the light reflected by the concave reflecting mirror are transmitted through the main lens group. Further, a prism mirror comprising the optical path deflection surface, for effecting field separation by the lens image height component, is also provided. As a result, it is possible to reduce the interval in the scanning direction between the second side projection optical system and the first side projection optical system without cutting out the lens into a rectangular shape.

Further, in the projection optical system P20 according to the above described second embodiment, although an image adjusting mechanism is not provided, it is possible to arrange the image adjusting mechanism in spaces between the mask M2 and the first lens group G21, between the first lens group G21 and the first optical path deflection surface FM21, between the second optical path deflection surface FM22 and the second lens group G22, between the second lens group G22 and the plate P2, and the like. The image rotation can be performed by rotating the prism provided with the first and second optical path deflection surfaces by a minute amount. The adjustment of the focus can be performed by moving the prism provided with the first and second optical path deflection surfaces in the direction of the main lens group LM2. The image shift in the scanning direction can be performed by moving the prism provided with the first and second optical path deflection surfaces in the perpendicular direction (vertical direction) between the mask M2 and the plate P2. Further, the image shift in the Y direction and the magnification adjustment can be performed by arranging a lens group which consists of three lenses comprising the same curvature, in one of the above described spaces, and by moving the lens at the center part of the lens group which consists of three lenses comprising the same curvature, in the perpendicular direction (vertical direction) between the mask M2 and the plate P2. Further, it is also possible to adjust the image position in the Y direction by integrally inclining three lenses in the Y direction.

Further, in the scanning type exposure apparatus according to the above described first embodiment, the projection optical apparatus provided with the first imaging optical system comprising the unmagnified projection magnification (unit magnification) and the imaging optical system comprising the enlargement projection magnification is used. However, it is possible to further increase the enlargement magnification of the whole projection optical apparatus by using an imaging optical system comprising two kinds of enlargement projection magnification, and to thereby enable the exposure to a large-sized plate to be easily performed without increasing the size of the mask.

Further, the above described first embodiment is provided with the first imaging optical system PL11 which forms an intermediate image of the pattern of the mask M, and the second imaging optical system PL12 which optically conjugates the intermediate image with the plate. Thereby, it is possible to easily arrange the image adjusting mechanism, and to arrange the field stop and the aperture diaphragm in desired positions.

Figure 9:
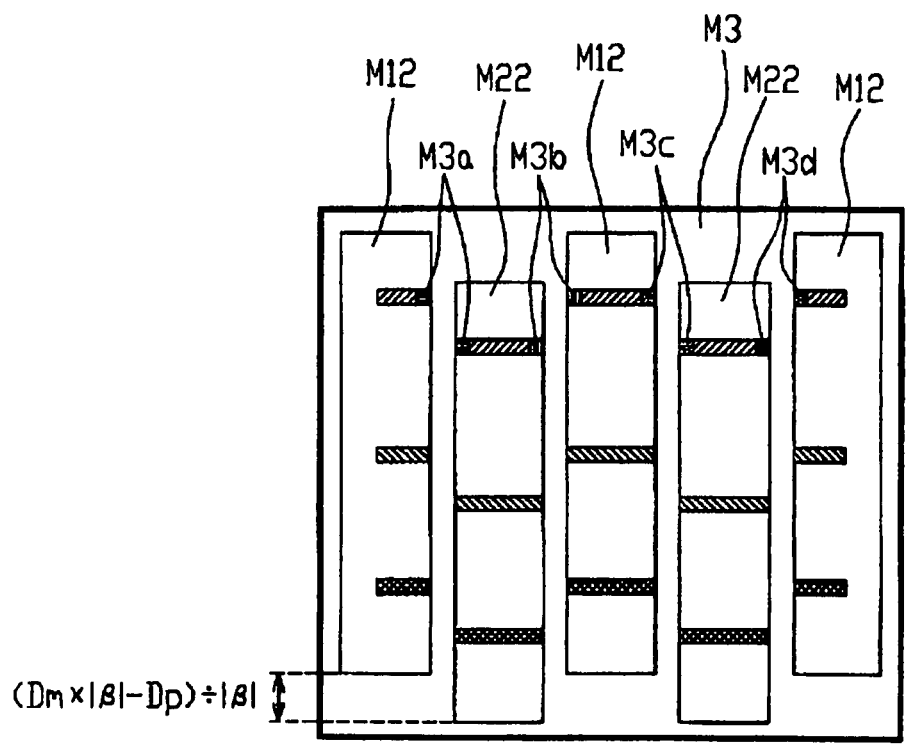
FIG. 9 is a figure showing a constitution of a mask (for an erecting image) according to the present embodiment.

FIG. 9 is a figure showing a mask used for the scanning type exposure apparatus provided with the projection optical apparatus which forms an erecting image, according to the above described embodiment As shown in FIG. 9, the mask M3 is provided with odd-numbered row pattern parts M12 and even-numbered row pattern parts M22 in the non-scanning direction (Y axis direction). Here, for example as shown in FIG. 9, in the odd-numbered row pattern parts M12 and the even-numbered row pattern parts M22, the numbering is performed in such a manner that when counted from the left in the non-scanning direction in FIG. 9, the first, third and fifth pattern parts are the odd-numbered pattern parts M12, and the second and fourth pattern parts are the even-numbered pattern parts M22. Note that the odd-numbered row pattern part M12 and the even-numbered row pattern part M22 may be constituted to include at least one pattern part, respectively.

Among the odd-numbered row pattern parts M12 and the even-numbered row pattern parts M22, common regions including a same pattern are formed at the ends in the non-scanning direction of at least one pair of the pattern parts adjacent to each other. Here, the common regions are formed on the sides where the pair of the odd-numbered row pattern part (M12) and the even-numbered row pattern part (M22) are adjacent to each other. For example, as shown in FIG. 9, common regions M3a, M3b, M3c and M3d are formed, respectively. Further, the odd-numbered row pattern part M12 and the even-numbered row pattern part M22 are arranged so as to deviate in the scanning direction (X axis direction) from each other by a predetermined amount of $\{(Dm\times|\beta|-Dp)/|\beta|\}$.

Figure 10:
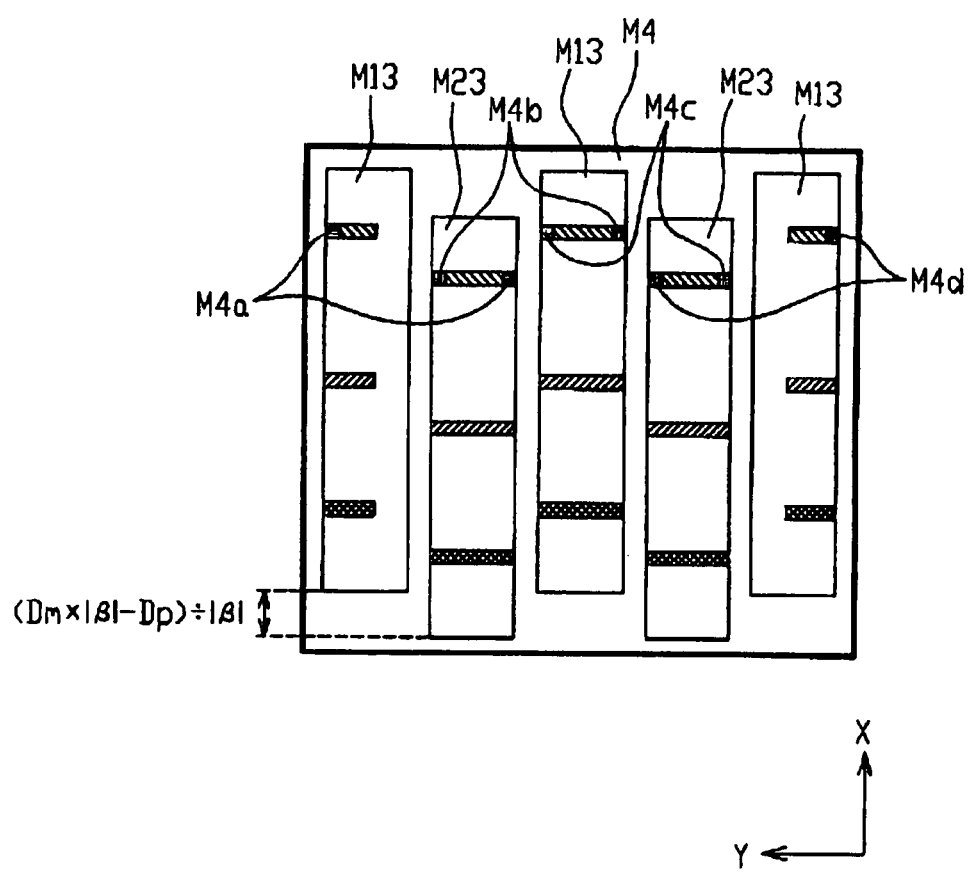
FIG. 10 is a figure showing a constitution of a mask (for an inverted image) according to the present embodiment.

FIG. 10 is a figure showing a mask used for the scanning type exposure apparatus provided with the projection optical apparatus which forms an inverted image, according to the above described embodiment. As shown in FIG. 10, the mask M4 is provided with odd-numbered row pattern parts M13 and even-numbered row pattern parts M23 in the non-scanning direction (Y axis direction), similarly to FIG. 9. Among the odd-numbered row pattern parts M13 and the even-numbered row pattern parts M23, common regions including a same pattern are formed at the ends in the non-scanning direction of at least one pair of the pattern parts adjacent to each other. Here, the common regions are formed on the sides opposite to the side where the pair of the odd-numbered row pattern part M13 and the even-numbered row pattern part M23 are adjacent to each other. For example, as shown in FIG. 10, common regions M4a, M4b, M4c and M4d are formed, respectively. Further, the odd-numbered row pattern part M13 and the even-numbered row pattern part M23 are arranged so as to deviate from each other in the scanning direction (X axis direction) by a predetermined amount of $\{(Dm\times|\beta|-Dp)/|\beta|\}$.

Note that in the masks shown in FIG. 9 and FIG. 10, the odd-numbered row pattern part and the even-numbered row pattern part need not be in contact with each other, and may be separated from each other at a predetermined distance. In the odd-numbered row pattern parts and the even-numbered row pattern parts, at least one pair of the adjacent common regions are transfer-exposed so that all or a part of the common regions are overlapped with each other to form one targeted pattern. Further, in the odd-numbered row pattern parts and the even-numbered row pattern parts, at least one pair of the adjacent common regions may be patterns which form the one targeted pattern by being overlapped with each other, and hence, it is not necessary that the patterns formed in the pair of common regions are completely the same. For example, out of a pair of common regions, there may be an unnecessary pattern which is not used at all, in either the common region of the odd-numbered row pattern part or the common region of the even-numbered row pattern part.

Further, for example, when the mask constituted as shown in FIG. 9 and FIG. 10 is used for the scanning type exposure apparatus according to the present embodiment, the predetermined amount by which the odd-numbered row pattern part and the even-numbered row pattern part are made to deviate from each other in the scanning direction, is not limited in particular, but is preferably set to 36 mm to 150 mm. When the enlargement magnification of the projection optical system is small, the predetermined amount by which the odd-numbered row pattern part and the even-numbered row pattern part are made to deviate from each other in the scanning direction, is reduced. This makes it possible to reduce the size of the mask, but the enlargement of the exposure region is not so expected. On the other hand, when the enlargement magnification of the projection optical system is large, the predetermined amount for the deviation is increased so that the size of the mask is increased. In view of the above points, the enlargement magnification of the projection optical system of the scanning type exposure apparatus according to the present embodiment is not specifically limited, but is preferably set to about 1.25 times to 4 times.

Here, for example, when the interval between the mask side field of views of the first projection optical system and the second projection optical system is set to 200 mm, with respect to this interval between the mask side field of views of the first projection optical system and the second projection optical system, the interval between the image fields of the first projection optical system and the second projection optical system needs to be set to 250 mm in the case where the enlargement magnification of the projection optical system is 1.25, and 800 mm in the case where the enlargement magnification of the projection optical system is 4. Thus, the predetermined amount by which the odd-numbered row pattern part and the even-numbered row pattern part are made to deviate from each other on the mask in the scanning direction, becomes 40 mm in the case where the enlargement magnification of the projection optical system is 1.25, and 150 mm in the case where the enlargement magnification of the projection optical system is 4.

Further, for example, when the interval between the mask side field of views of the first projection optical system and the second projection optical system is set to 180 mm, with respect to this interval between the mask side field of views of the first projection optical system and the second projection optical system, the interval between the image fields of the first projection optical system and the second projection optical system needs to be set to 225 mm in the case where the enlargement magnification of the projection optical system is 1.25, and 720 mm in the case where the enlargement magnification of the projection optical system is 4. Thus, the predetermined amount by which the odd-numbered row pattern part and the even-numbered row pattern part are made to deviate from each other on the mask in the scanning direction, becomes 36 mm in the case where the enlargement magnification of the projection optical system is 1.25, and 135 mm in the case where the enlargement magnification of the projection optical system is 4.

According to the embodiments of FIGS. 9 and 10, it is possible to avoid an increase in the size of the mask even when a pattern of the mask is transferred to a large-sized plate, as a result of which the production cost of the mask can be reduced.

Figure 11:
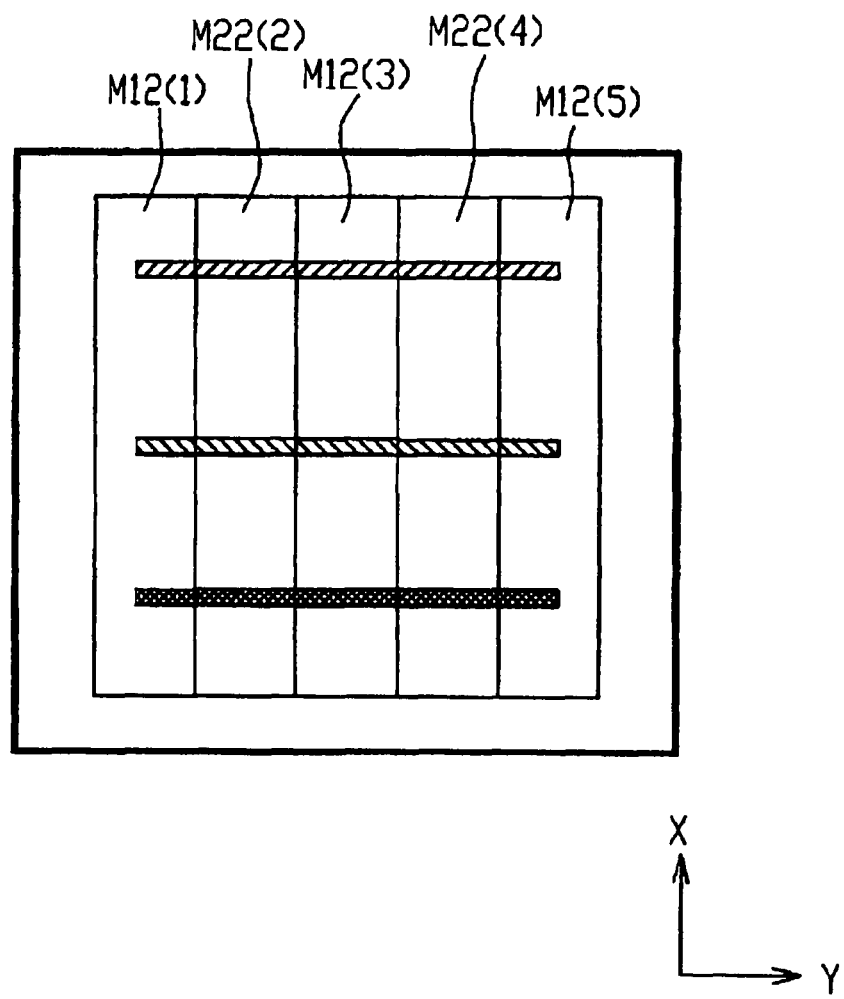
FIG. 11 is a figure for explaining a manufacturing method of the mask (for the erecting image) according to the present embodiment.

Next, the manufacturing method of the mask used for the scanning type exposure apparatus according to the above described embodiment is explained. First, a manufacturing method of the mask used for the scanning type exposure apparatus provided with the projection optical apparatus which forms an erecting image, according to the above described embodiment, is explained. First, as shown in FIG. 11, pattern data corresponding to the whole pattern formed on the mask is divided in a first direction (Y direction) as the non-scanning direction. That is, the pattern data is divided into five parts of M12(1), M22(2), M12(3), M22(4) and M12(5).

Next, as shown in FIG. 12, pattern data corresponding to common regions are added to the ends of at least one divided region in the first direction (Y direction), to create drawing data. That is, as shown in FIG. 12, the pattern data of M3a are created in the common regions of M12(1) and M22(2), and the pattern data of M3b are created in the common regions of M22(2) and M12(3). Also in other common regions, pattern data of M3c and M3d are similarly created.

Next, in accordance with the drawing data corresponding to the respective divided regions, the patterns are respectively drawn on a mask substrate (blanks) so as to deviate by a predetermined amount in a second direction as the scanning direction by using an EB exposure apparatus and the like. Thereby, the mask shown in FIG. 9 can be produced.

Next, a manufacturing method of a mask used for the scanning type exposure apparatus provided with the projection optical apparatus which forms an inverted image, according to the above described embodiment, is explained. First, as shown in FIG. 13, pattern data corresponding to the whole pattern formed on the mask is divided in the first direction (Y direction) as the non-scanning direction. That is, the pattern data is divided into five parts of M13(1), M23(2), M13(3), M23(4) and M13(5).

Figure 14:
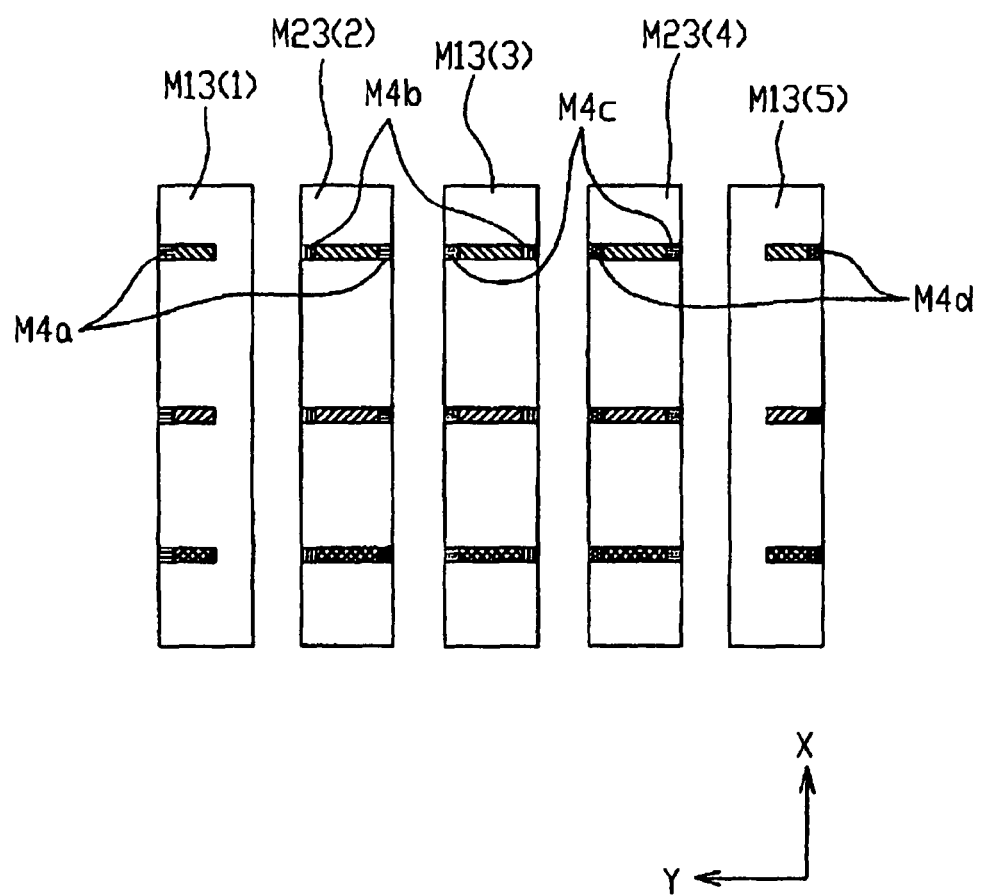
FIG. 14 is a figure for explaining the manufacturing method of the mask (for the inverted image) according to the present embodiment.

Next, as shown in FIG. 14, pattern data corresponding to common regions are added to the ends of at least one divided region in the first direction (Y direction), to create drawing data. That is, as shown in FIG. 14, the pattern data of M4a are created in the common regions of M13(1) and M23(2), and the pattern data of M4b are created in the common regions of M23(2) and M13(3). Also in other common regions, pattern data of M4c and M4d are similarly created.

Next, in accordance with drawing data corresponding to the respective divided regions, the respective patterns are drawn on a mask substrate (blanks) so as to deviate by a predetermined amount in the second direction as the scanning direction by using the EB exposure apparatus and the like. Thereby, the mask shown in FIG. 10 can be produced.

Note that in the above described manufacturing methods of the masks shown in FIG. 9 and FIG. 10, pattern data corresponding to whole patterns are divided and thereafter pattern data corresponding to common regions are added, but whole pattern data including common regions may also be divided into pattern data corresponding to at least one pair of the odd-numbered row pattern part and the even-numbered row pattern part which are adjacent to each other, and then in accordance with the divided pattern data, the patterns are drawn on a mask substrate (blanks) so as to deviate by a predetermined amount in the second direction by using the EB exposure apparatus and the like. According to the above described manufacturing method of a mask, it is possible to reduce the production cost of the mask.

Figure 8:
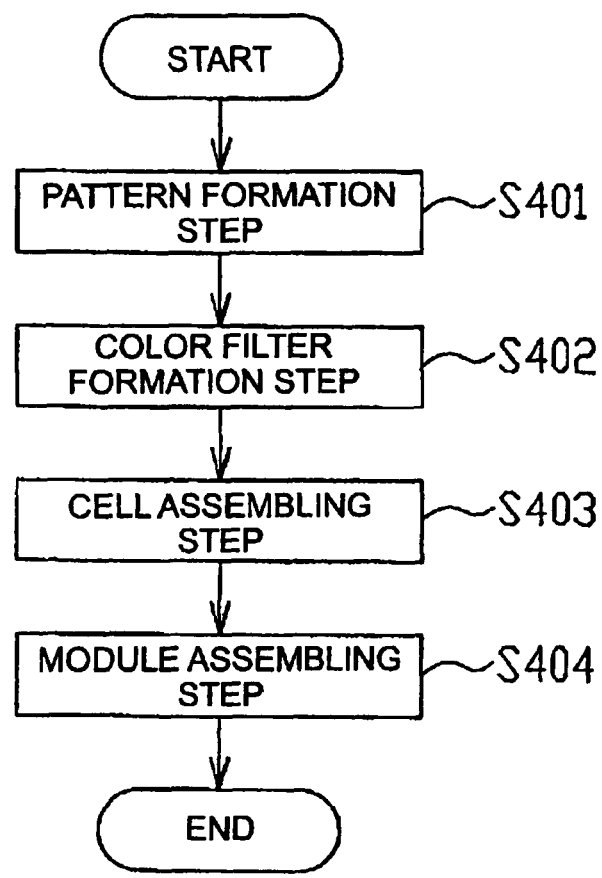
FIG. 8 is a flow chart for explaining a manufacturing method of a micro-device according to the present embodiment.

Further, in the exposure apparatus according to the present embodiment, a liquid crystal display device as a micro-device can also be obtained by forming predetermined patterns (a circuit pattern, an electrode pattern, and the like) on a plate (glass substrate). In the following, an example of the method in this case is explained with reference to a flowchart shown in FIG. 8. In FIG. 8, in pattern forming step 401, a so-called photolithography step for transfer-exposing a pattern of a mask onto a photosensitive substrate by using the scanning type exposure apparatus according to the present embodiment, is performed. A predetermined pattern including a number of electrodes and the like is formed on the photosensitive substrate by this photolithography step. Then, the exposed substrate is treated in the respective steps such as a developing step, an etching step, and a photo-resist removing step, whereby a predetermined pattern is formed on the substrate. Then, the process proceeds to the following color filter forming step 402.

Next, in the color filter forming step 402, a color filter is formed in which a number of groups of three dots corresponding to R (Red), G (Green), and B (Blue) are arranged in a matrix form, or in which groups of three stripe filters of R, G and B are arranged in the direction of a plurality of horizontal scanning lines. Then, a cell assembling step 403 is performed after the color filter forming step 402. In the cell assembling step 403, a liquid crystal panel (liquid crystal cell) is assembled by using the substrate including the predetermined pattern obtained in the pattern forming step 401, the color filter obtained in the color filter forming step 402, and the like. In the cell assembling step 403, for example, a liquid crystal panel (liquid crystal cell) is produced by injecting a liquid crystal between the substrate including the predetermined pattern obtained in the pattern forming step 401, and the color filter obtained in the color filter forming step 402.

Then, in the module assembling step 404, the liquid crystal panel is completed as the liquid crystal display device by being provided with respective components such as an electrical circuit and a backlight, which enable the assembled liquid crystal panel (liquid crystal cell) to perform display operations. According to the above described manufacturing method of the liquid crystal display device, the scanning type exposure apparatus according to the present embodiment is used, and hence it is possible to produce the liquid crystal display device at low cost. According to the above described manufacturing method of the liquid crystal display device, the mask according to the present embodiment is used, and hence it is possible it is possible to produce the microdevice by using a large-sized substrate, while avoiding an increase in the size of a mask, as a result of which the micro-device can be produced at low cost.

Note that in the above described embodiments, a catadioptric imaging optical system is applied as the projection optical systems PL1, PL2, PL10 and PL20, but the present invention is not limited to these embodiments. For example, it is possible to apply a dioptric imaging optical system provided with a plurality of refraction optical elements arranged in the optical axis extended in one straight line. In this case, it is preferred to make the center of the field of views and the center of the image fields of the dioptric imaging optical system coincident with each other. As such a dioptric imaging optical system, for example, a projection optical system disclosed in U.S. Pat. No. 5,903,400 is applicable. Here, U.S. Pat. No. 5,903,400 is incorporated herein by reference. Further, a reflection imaging optical system may also be applied as the projection optical systems PL1, PL2, PL10 and PL20.

In the following, an example 1 and an example 2 will be explained, but the constitution of the catadioptric optical systems according to the example 1 and the example 2 is the same as those of the catadioptric optical systems according to the first and second embodiments shown in FIG. 2 and FIG. 6, respectively. Therefore, reference numerals and characters which are used for explaining the catadioptric optical systems according to the first and second embodiments, are used for explaining the catadioptric optical systems according to the example 1 and the example 2. The optical member items of the catadioptric optical systems PL1 and PL20 according to the example 1 and the example 2 are shown in Table 1 and Table 2. In Table 1 and Table 2 showing the optical member items, a surface number in the first column represents the order of the surfaces along the direction of light beam traveling from the object side, a value in the second column represents a radius of curvature (mm) of each surface, a surface interval in the third column represents a surface interval (mm) on the optical axis, a value in the fourth column represents an effective radius of an optical member, a value in the fifth column represents a refractive index of glass material of an optical member to i line, a value in the sixth column represents a refractive index of glass material of an optical member to h line, and a value in the seventh column represents a refractive index of glass material of an optical member to g line, respectively.

EXAMPLE 1

Specification values of the catadioptric optical system PL1 according to the example 1 are shown.

(Specifications)

Projection magnification: 1.2 times

TABLE 1

(Optical member specifications)

| mem | r | d | E.Rad | n(i) | n(h) | n(g) |
|---|---|---|---|---|---|---|
| 0) | ∞ | 32.48876 | | 1 | | |
| 1) | ∞ | 10 | 88.25 | 1.474559 | 1.469637 | 1.468712 |
| 2) | ∞ | 10 | 68.82 | 1.474559 | 1.469637 | 1.468712 |
| 3) | ∞ | 8 | 67.39 | 1.488769 | 1.482726 | 1.480319 |
| 4) | ∞ | 8 | 67.54 | 1.488769 | 1.482725 | 1.480319 |
| 5) | ∞ | 98 | 68.3 | 1 | | |
| 6) | ∞ | −20.5092 | 99.85 | −1 | | |
| 7) | −887.44 | −28.1011 | 78.62 | −1.48677 | −1.48273 | −1.48032 |
| 8) | 266.84 | −2.12666 | 78.95 | −1 | | |
| 9) | 263.48 | −18.3583 | 78.72 | −1.81279 | −1.60086 | −1.59415 |
| 10) | 548.34 | −421.574 | 79.95 | −1 | | |
| 11) | −499.95 | −20.1841 | 75.74 | −1.47456 | −1.46984 | −1.46671 |
| 12) | 1659.92 | −216.85 | 75.03 | −1 | | |
| 13) | 435.481 | −12.1088 | 52.57 | −1.47456 | 1.46984 | −1.46671 |
| 14) | −780.54 | −10.9683 | 52.05 | −1 | | |
| 15) | 452.783 | −13.1258 | 51.96 | −1.48677 | −1.48273 | −1.48032 |
| 16) | 269.876 | −18.8971 | 52.28 | −1 | | |
| 17) | 970.52 | 18.99714 | 51.05 | 1 | | |
| 18) | 269.876 | 13.12558 | 52.28 | 1.488769 | 1.482725 | 1.480319 |
| 19) | 452.783 | 10.9693 | 51.95 | 1 | | |
| 20) | −780.64 | 12.10882 | 52.05 | 1.474559 | 1.469637 | 1.466712 |
| 21) | 435.481 | 218.8502 | 52.57 | 1 | | |
| 22) | 1859.92 | 20.18406 | 75.03 | 1.474559 | 1.469637 | 1.466712 |
| 23) | −499.95 | 421.5738 | 75.74 | 1 | | |
| 24) | 548.34 | 18.35825 | 79.95 | 1.812788 | 1.600859 | 1.594152 |
| 25) | 263.46 | 2.12666 | 78.73 | 1 | | |
| 26) | 266.84 | 28.10105 | 78.98 | 1.486769 | 1.482725 | 1.480319 |
| 27) | −887.44 | 20.5092 | 78.62 | 1 | | |
| 28) | ∞ | −182.314 | 99.87 | −1 | | |
| 29) | ∞ | −10 | 65.83 | −1 | | ← Intermediate image |
| 30) | 854.2579 | −23.75 | 65.45 | −1.48032 | −1.48273 | −1.48677 |
| 31) | 183.6923 | −8.39651 | 67.56 | −1 | | |
| 32) | 160.1273 | −10.625 | 67.12 | −1.59415 | −1.60066 | −1.61279 |
| 33) | 270.1107 | −12.1483 | 69.21 | −1 | | |
| 34) | 183.5373 | −24.25 | 69.57 | −1.48032 | −1.48273 | −1.48677 |
| 35) | 159.5677 | −62 | 72.87 | −1 | | |
| 36) | ∞ | 100.3484 | 103.08 | 1 | | |
| 37) | 3065.233 | 30.83885 | 72.98 | 1.466712 | 1.469637 | 1.474559 |
| 38) | −575.858 | 458.3267 | 72.79 | 1 | | |
| 39) | −461.759 | 18.98521 | 52.32 | 1.466712 | 1.469637 | 1.474559 |
| 40) | −2030.49 | 10.33669 | 55.87 | 1 | | |

TABLE 1-continued

| | | | | | | |
|---|---|---|---|---|---|---|
| 41) | −804.174 | 22.9186 | 57.66 | 1.480319 | 1.482725 | 1.486769 |
| 42) | −412.815 | 10.74294 | 61.17 | 1 | | |
| 43) | −973.178 | −10.7429 | 63.59 | −1 | | |
| 44) | −412.815 | −22.9186 | 84.26 | −1.48032 | −1.48273 | −1.48677 |
| 45) | −804.174 | −10.3367 | 63.9 | −1 | | |
| 46) | −2030.49 | −18.9952 | 64 | −1.46671 | −1.46964 | −1.47458 |
| 47) | −461.759 | −458.325 | 83.96 | −1 | | |
| 48) | −575.858 | −30.8389 | 92.99 | −1.46671 | −1.46964 | −1.47458 |
| 49) | 3055.233 | −100.348 | 92.78 | −1 | | |
| 50) | ∞ | 181.8825 | 123.89 | 1 | | |
| 51) | −826.645 | 20.62295 | 84.93 | 1.480319 | 1.482725 | 1.486769 |
| 52) | −2102.18 | 4.54889 | 85.27 | 1 | | |
| 53) | 499.5769 | 21.54359 | 85.29 | 1.594152 | 1.800859 | 1.612786 |
| 54) | 275.9227 | 14.72975 | 83.57 | 1 | | |
| 55) | 298.8991 | 22.5 | 84.82 | 1.480319 | 1.482725 | 1.486769 |
| 56) | −3532.15 | 76.31644 | 84.48 | 1 | | |
| 57) | ∞ | | | | | |

EXAMPLE 2

Specification values of the catadioptric optical system PL20 according to the example 2 are shown.

(Specifications)

Projection magnification: 1.2 times

TABLE 2

(Optical member specifications)

| men | r | d | E. Rad | n(i) | n(h) | n(g) |
|---|---|---|---|---|---|---|
| 0) | ∞ | 40.5 | | 1 | | |
| 1) | −881.74 | 25.7 | 70.17 | 1.486769 | 1.482725 | 1.480319 |
| 2) | −197.34 | 6.1 | 71.68 | 1 | | |
| 3) | −178.09 | 21.6 | 71.5 | 1.612786 | 1.600859 | 1.594152 |
| 4) | −298.91 | 12.0 | 75.24 | 1 | | |
| 5) | −198.12 | 25.7 | 75.67 | 1.486769 | 1.482725 | 1.480319 |
| 6) | −177.77 | 70.0 | 79.54 | 1 | | |
| 7) | ∞ | −142.0 | 112.83 | −1 | | |
| 8) | −1132.29 | −41.6 | 85.75 | −1.47456 | −1.46964 | −1.46671 |
| 9) | 761.59 | −387.9 | 85.53 | −1 | | |
| 10) | 477.18 | −24.8 | 60.83 | −1.47456 | −1.46964 | −1.46671 |
| 11) | 7398.48 | −11.7 | 60.79 | −1 | | |
| 12) | 727.98 | −18.6 | 60.73 | −1.48677 | −1.48273 | −1.48032 |
| 13) | 388.24 | −8.9 | 61.11 | −1 | | |
| 14) | 958.61 | 8.9 | 60.6 | 1 | | |
| 15) | 368.24 | 18.6 | 61.32 | 1.486769 | 1.482725 | 1.480319 |
| 16) | 727.98 | 11.7 | 61.13 | 1 | | |
| 17) | 7398.48 | 24.8 | 61.35 | 1.474559 | 1.469637 | 1.466712 |
| 18) | 477.18 | 387.9 | 81.73 | 1 | | |
| 19) | 761.59 | 41.6 | 93.79 | 1.474559 | 1.469637 | 1.446712 |
| 20) | −1132.29 | 152.0 | 94.28 | 1 | | |
| 21) | ∞ | −192.7 | 127.44 | −1 | | |
| 22) | 662.55 | −22.0 | 88.47 | −1.48677 | −1.48273 | −1.48032 |
| 23) | 1777.62 | −0.4 | 89.31 | −1 | | |
| 24) | −532.47 | −47.1 | 89.56 | −1.61279 | −1.80086 | 1.59415 |
| 25) | −269.87 | −7.7 | 86.88 | −1 | | |
| 26) | −289.53 | −33.8 | 87.79 | −1.48677 | −1.48273 | −1.48032 |
| 27) | 835.50 | −58.9 | 87.51 | −1 | | |
| 28) | ∞ | | 86.08 | −1 | | |

The invention is not limited to the fore going embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. A scanning exposure apparatus that exposes a pattern of a first object onto a second object by moving the first object and the second object synchronously with each other in a first direction, comprising:
    a first projection optical system which forms an enlargement image of an area within a field of view on the first object onto an image field on the second object; and
    a second projection optical system arranged with an interval with respect to the first projection optical system in the first direction and a second direction perpendicular to the first direction, which forms an enlargement image of an area within a field of view on the first object onto an image field on the second object,
    wherein when an interval in the first direction between a center of the field of view of the first projection optical system and a center of the field of view of the second projection optical system is set as Dm, an interval in the first direction between a center of an image field formed by the first projection optical system and a center of an image field formed by the second projection optical system is set as Dp, and projection magnification of each of the first projection optical system and the second projection optical system is set as β, a condition: Dp<Dm×|β| (where, |β|>1) is satisfied, and,
    wherein the pattern on the first object includes a first row pattern part arranged correspondingly to the first projection optical system, and a second row pattern part arranged correspondingly to the second projection optical system, the first row pattern part and the second row pattern part each include a first end and a second end disposed at opposite ends of the row pattern parts in the first direction, the first and second ends of adjacent first and second row pattern parts deviate from each other in the first direction by an amount given by (Dm×|β|−Dp)/|β|.

2. The scanning exposure apparatus according to claim 1, wherein the first projection optical system and the second projection optical system include a catadioptric optical system, respectively, and
    wherein the catadioptric optical system comprises:
    a first concave reflecting mirror arranged in an optical path between the first object and the second object;
    a first optical path deflection surface which is arranged in an optical path between the first object and the first concave reflecting mirror and deflects the optical path;

a first main lens group arranged in an optical path between the first optical path deflection surface and the first concave reflecting mirror; and a second optical path deflection surface which is arranged in an optical path between the first main lens group and the second object and deflects the optical path.

3. The scanning exposure apparatus according to claim 1, wherein a first pattern transfer region formed on the second object by an enlarged image of the first row pattern part projected by the first projection optical system, and a second pattern transfer region formed on the second object by an enlarged image of the second row pattern part projected by the second projection optical system are partially overlapped with each other in the second direction.

4. The scanning exposure apparatus according to claim 1, wherein the first projection optical system and the second projection optical system include an optical characteristic adjusting mechanism.

5. The scanning exposure apparatus according to claim 4,
wherein each of the first and second projection optical system includes a first imaging optical system for forming an intermediate image of the first object and a second imaging optical system which optically conjugates the intermediate image with the second object, and
wherein the optical characteristic adjusting mechanism is provided in the optical path of the first imaging optical system.

6. The scanning exposure apparatus according to claim 4, wherein each of the first and second projection optical system comprises:
a first imaging optical system which forms an intermediate image of the first object; and
a second imaging optical system which optically conjugates the intermediate image with the second object,
wherein one of the first imaging optical system and the second imaging optical system includes nearly unit projection magnification, and the other optical system includes enlargement projection magnification, and an optical characteristic adjusting mechanism is arranged in an optical path of the optical system including the nearly unit projection magnification.

7. The scanning exposure apparatus according to claim 6, wherein the first imaging optical system includes nearly unit projection magnification, and
wherein an aperture diaphragm is arranged in the first imaging optical system.

8. The scanning exposure apparatus according to claim 1, wherein the second object is a photosensitive substrate comprising an outer diameter larger than 500 mm.

9. A manufacturing method of manufacturing a microdevice comprising:
exposing a pattern of a mask on a photosensitive substrate with the scanning exposure apparatus according to claim 1; and
developing the photosensitive substrate exposed by the exposure of the pattern.

10. A scanning exposure apparatus that exposes an image of a pattern formed on a mask onto a photosensitive substrate by moving the photosensitive substrate in a first direction, comprising:
a stage device which holds the mask having a first row pattern part and a second row pattern part, and which moves the mask with respect to the photosensitive substrate, the first row pattern part and the second row pattern part being arranged in a second direction perpendicular to the first direction with an interval among them, the first row pattern part and the second row pattern part each include a first end and a second end disposed at opposite ends of the row pattern parts in the first direction, and the first and second ends of adjacent first and second row pattern parts deviate from each other in the first direction by a predetermined amount;
a first projection optical system which projects an enlargement image of the first row pattern part of the mask which is being moved in the first direction, onto the photosensitive substrate; and
a second projection optical system arranged with an interval with respect to the first projection optical system in the first and second directions, which projects an enlargement image of the second row pattern part of the mask which is being moved in the first direction onto the photosensitive substrate,
wherein the predetermined amount is set based on an interval in the first direction between a center of a field of view of the first projection optical system and a center of a field of view of the second projection optical system, an interval in the first direction between a center of an image field formed by the first projection optical system and a center of an image field formed by the second projection optical system, and projection magnification of each of the first projection optical system and the second projection optical system.

11. The scanning exposure apparatus according to claim 10, wherein when the interval in the first direction between the center of the field of view of the first projection optical system and the center of the field of view of the second projection optical system is set as Dm, the interval in the first direction between the center of the image field formed by the first projection optical system and the center of the image field formed by the second projection optical system is set as Dp, and the projection magnification of each of the first projection optical system and the second projection optical system is set as $\beta$, a condition: $Dp < Dm \times |\beta|$ (where, $|\beta| > 1$) is satisfied, and the predetermined amount is given by $(Dm \times |\beta| - Dp)/|\beta|$.

12. The scanning exposure apparatus according to claim 10, wherein the predetermined amount is set so that (1) an edge position of a first pattern transfer region formed on the photosensitive substrate by the enlargement image of the first row pattern part and (2) an edge position of a second pattern transfer region formed on the photosensitive substrate by the enlargement image of the second row pattern part are matched with each other.

13. A manufacturing method of manufacturing a microdevice comprising:
exposing enlargement images of first and second row pattern parts on a photosensitive substrate with the scanning exposure apparatus according to claim 10; and
processing the photosensitive substrate in which the enlargement images of the first and second row pattern parts are exposed.

14. A scanning exposure method of exposing an image of a pattern formed on a mask onto a photosensitive substrate while moving the photosensitive substrate in a first direction, comprising:
moving the mask having a first row pattern part and a second row pattern part with respect to the photosensitive substrate, the first row pattern part and the second row pattern part being arranged in a second direction perpendicular to the first direction with an interval among them, the first row pattern part and the second row pattern part each include a first end and a second end disposed at opposite ends of the row pattern parts in the first direction, and the first and second ends of adjacent first and second row pattern parts deviate from each other in the first direction by a predetermined amount;

projecting an enlargement image of the first row pattern part of the mask which is being moved in the first direction onto the photosensitive substrate by a first projection optical system; and projecting an enlargement image of the second row pattern part of the mask which is being moved in the first direction onto the photosensitive substrate by a second projection optical system arranged with an interval with respect to the first projection optical system in the first and second directions;

wherein the predetermined amount is set based on an interval in the first direction between a center of a field of view of the first projection optical system and a center of a field of view of the second projection optical system, an interval in the first direction between a center of an image field formed by the first projection optical system and a center of an image field formed by the second projection optical system, and projection magnification of each of the first projection optical system and the second projection optical system.

15. The scanning exposure method according to claim 14, wherein when the interval in the first direction between the center of the field of view of the first projection optical system and the center of the field of view of the second projection optical system is set as Dm, the interval in the first direction between the center of the image field formed by the first projection optical system and the center of the image field formed by the second projection optical system is set as Dp, and the projection magnification of each of the first projection optical system and the second projection optical system is set as $\beta$, a condition: Dp<Dm×|$\beta$| (where, |$\beta$|>1) is satisfied, and the predetermined amount is given by (Dm×|$\beta$|−Dp)/|$\beta$|.

16. The scanning exposure method according to claim 14, wherein the predetermined amount is set so that (1) an edge position of a first pattern transfer region formed on the photosensitive substrate by the enlargement image of the first row pattern part and (2) an edge position of a second pattern transfer region formed on the photosensitive substrate by the enlargement image of the second row pattern part are matched with each other.

17. The scanning exposure method according to claim 14, wherein a first pattern transfer region formed on the photosensitive substrate by the enlargement image of the first row pattern part and a second pattern transfer region formed on the photosensitive substrate by the enlargement image of the second row pattern part are formed by one synchronous movement of the mask and the photosensitive substrate in the first direction.

18. The scanning exposure method according to claim 14, wherein a first pattern transfer region formed on the photosensitive substrate by the enlargement image of the first row pattern part and a second pattern transfer region formed on the photosensitive substrate by the enlargement image of the second row pattern part are exposed so that they are partially overlapped with each other in the second direction.

19. The scanning exposure method according to claim 14, wherein the photosensitive substrate has an outer diameter larger than 500 mm.

20. A manufacturing method of manufacturing a micro device, comprising:

exposing enlargement images of first and second row pattern parts on a photosensitive substrate by using the scanning exposure method according to claim 14; and processing the photosensitive substrate in which the enlargement images of the first and second row pattern parts are exposed.

* * * * *

UNITED STATES PATENT AND TRADEMARK OFFICE
CERTIFICATE OF CORRECTION

| | | |
|---|---|---|
| PATENT NO. | : 8,654,307 B2 | Page 1 of 1 |
| APPLICATION NO. | : 11/723124 | |
| DATED | : February 18, 2014 | |
| INVENTOR(S) | : Masaki Kato | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 762 days.

Signed and Sealed this
First Day of September, 2015

Michelle K. Lee
*Director of the United States Patent and Trademark Office*